US009515035B2

(12) United States Patent
Sullivan et al.

(10) Patent No.: US 9,515,035 B2
(45) Date of Patent: Dec. 6, 2016

(54) THREE-DIMENSIONAL INTEGRATED CIRCUIT INTEGRATION

(71) Applicant: International Business Machines Corporation, Armonk, NY (US)

(72) Inventors: Timothy D. Sullivan, Underhill, VT (US); Thomas A. Wassick, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/577,230

(22) Filed: Dec. 19, 2014

(65) Prior Publication Data
US 2016/0181215 A1    Jun. 23, 2016

(51) Int. Cl.
H01L 23/00 (2006.01)
H01L 21/66 (2006.01)
H01L 21/768 (2006.01)
H01L 23/498 (2006.01)

(52) U.S. Cl.
CPC ......... H01L 24/10 (2013.01); H01L 21/76898 (2013.01); H01L 22/14 (2013.01); H01L 23/49827 (2013.01); H01L 23/49833 (2013.01); H01L 23/49838 (2013.01)

(58) Field of Classification Search
CPC ................................ G01L 1/205; G01R 27/02
USPC ........................................................ 324/691
See application file for complete search history.

(56) References Cited

U.S. PATENT DOCUMENTS

| 6,822,327 | B1 | 11/2004 | Mithal et al. |
| 7,253,528 | B2 | 8/2007 | Dauksher et al. |
| 7,911,803 | B2 | 3/2011 | Daubenspeck et al. |
| 8,048,794 | B2 | 11/2011 | Knickerbocker |

(Continued)

FOREIGN PATENT DOCUMENTS

| EP | 2341356 A1 | 7/2011 |
| JP | 2012174791 A | 9/2012 |

(Continued)

OTHER PUBLICATIONS

Hyperphysics, Resistivity and Condcutivity, http://hyperphysics.phy-astr.gsu.edu/hbase/electric/resis.html, Feb. 7, 2016, p. 1-4.*

(Continued)

Primary Examiner — Thomas Valone
(74) Attorney, Agent, or Firm — Scully, Scott, Murphy & Presser, P.C.; Steven J. Meyers

(57) ABSTRACT

Wiring structures, methods for providing a wiring structure, and methods for distributing currents with a wiring structure from one or more through-substrate vias to multiple bumps. A first current is directed from a first through-substrate via of a first electrical resistance through a first connection line to a first bump and directing a second current from the first through-substrate via through a second connection line of a second electrical resistance to a second bump. The first connection line has a first length relative to a first position of the first bump and a first cross-sectional area, the second connection line has a second length relative to a first position of the second bump and a second cross-sectional area, the second length is different from the first length, and the second cross-sectional area is different from the first cross-sectional area.

12 Claims, 5 Drawing Sheets

(56) References Cited

U.S. PATENT DOCUMENTS

| | | |
|---|---|---|
| 8,153,520 B1 | 4/2012 | Chandrashekar et al. |
| 8,193,039 B2 | 6/2012 | Su et al. |
| 8,212,357 B2 | 7/2012 | Daubenspeck et al. |
| 8,294,149 B2 | 10/2012 | Bernstein et al. |
| 8,338,961 B2 | 12/2012 | Su et al. |
| 8,384,225 B2 | 2/2013 | Rahman et al. |
| 8,384,411 B2 | 2/2013 | Mooyman-Beck et al. |
| 8,487,447 B2 | 7/2013 | Interrante et al. |
| 8,531,030 B2 | 9/2013 | Howard et al. |
| 8,575,007 B2 | 11/2013 | Daubenspeck et al. |
| 8,592,932 B2 | 11/2013 | Andry et al. |
| 2010/0206737 A1 | 8/2010 | Preisser |
| 2011/0042820 A1 | 2/2011 | Knickerbocker |
| 2011/0148456 A1 | 6/2011 | Mooyman-Beck et al. |
| 2011/0193197 A1 | 8/2011 | Farooq et al. |
| 2011/0221033 A1* | 9/2011 | Boulay ............... H01L 24/49 257/531 |
| 2012/0024713 A1 | 2/2012 | Preisser |
| 2012/0061821 A1 | 3/2012 | Black et al. |
| 2012/0074579 A1 | 3/2012 | Su et al. |
| 2012/0119374 A1 | 5/2012 | Rahman et al. |
| 2012/0138471 A1 | 6/2012 | Mayer et al. |
| 2012/0153458 A1 | 6/2012 | Howard et al. |
| 2012/0205791 A1 | 8/2012 | Su et al. |
| 2012/0280395 A1 | 11/2012 | Farooq et al. |
| 2012/0286428 A1 | 11/2012 | Sakuma |
| 2013/0026606 A1 | 1/2013 | Farooq et al. |
| 2013/0049193 A1 | 2/2013 | Sakuma |
| 2013/0105969 A1 | 5/2013 | Horibe |
| 2013/0134421 A1* | 5/2013 | Takakura ............ H01L 23/481 257/48 |
| 2013/0143364 A1 | 6/2013 | Lin et al. |
| 2015/0262910 A1* | 9/2015 | Sun ..................... H01L 23/481 327/306 |

FOREIGN PATENT DOCUMENTS

| | | |
|---|---|---|
| JP | 2012238752 A | 12/2012 |
| JP | 2013093507 A | 5/2013 |
| WO | 2010094998 A1 | 8/2010 |
| WO | 2012034034 A1 | 3/2012 |
| WO | 2012040274 A1 | 3/2012 |
| WO | 2012064435 A1 | 5/2012 |
| WO | 2012083110 A2 | 6/2012 |
| WO | 2012111814 A1 | 8/2012 |
| WO | 2012151229 A2 | 11/2012 |
| WO | 2013005355 A1 | 1/2013 |

OTHER PUBLICATIONS

J. U. Knickerbocker et al., "Three-dimensional silicon integration," IBM Journal of Research and Development, vol. 52, No. 6, 2008, pp. 553-569.

* cited by examiner

THREE-DIMENSIONAL INTEGRATED CIRCUIT INTEGRATION

BACKGROUND

The invention generally relates to semiconductor manufacturing and, more particularly, to wiring structures, methods for providing a wiring structure, and methods for distributing currents with a wiring structure from one or more through-substrate vias to multiple bumps.

Stacked chips may be used to increase the function that can be provided by a single package. The constituent chips of the chip stack are arranged in a compact three-dimensional stack characterized by multiple levels. The functionality of a chip stack requires functionality of each individual chip. The stacked arrangement of the three-dimensional integration conserves space and shortens signal transmission distances for inter-chip communications, which may improve both efficiency and performance of the chip stack. During manufacture, each chip is processed independently to form integrated circuits. The different chips are subsequently stacked in a three-dimensional arrangement and bonded so that the chips are vertically arranged with permanent attachment to each other.

Signals and power must be transmitted to all silicon chips in the chip stack. One approach is to provide a conductor that penetrates from one side of a chip or interposer to the opposite side of the chip or interposer. Such conductors are often called through-substrate vias (TSVs). One way of stacking the chips is by using solder bumps between the chips, which are used in conjunction with the TSVs to distribute power and signals.

Improved wiring structures, methods for providing a wiring structure, and methods for distributing currents with a wiring structure from one or more through-substrate vias to multiple bumps are needed.

SUMMARY

In an embodiment of the invention, a method includes directing a first current from a first through-substrate via through a first connection line to a first bump and directing a second current from the first through-substrate via through a second connection line to a second bump. The first connection line has a first length relative to a first position of the first bump and a first cross-sectional area, the second connection line has a second length relative to a first position of the second bump and a second cross-sectional area, the second length is different from the first length, and the second cross-sectional area is different from the first cross-sectional area.

In an embodiment of the invention, a structure comprising a first bump, a second bump, a first through-substrate via, and wiring including a first connection line coupling the first through-substrate via with the first bump and a second connection line coupling the first through-substrate via with the second bump. The first connection line has a first length relative to a first position of the first bump and a first cross-sectional area. The second connection line has a second length relative to a second position of the second bump and a second cross-sectional area different from the first cross-sectional area.

In an embodiment of the invention, a method is provided for providing a wiring structure coupled with a through-substrate via. The method includes receiving, at a processor, a first current and a first length for a first connection line coupling the through-substrate via with a first bump, and receiving, at the processor, a second current and a second length for a second connection line coupling the through-substrate via with a second bump. The processor determines a first cross-sectional area for the first connection line based upon the first current and the first length such that the first connection line has a first electrical resistance. The processor determines a second cross-sectional area for the second connection line based upon the second current and the second length such that the second connection line has a second electrical resistance.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
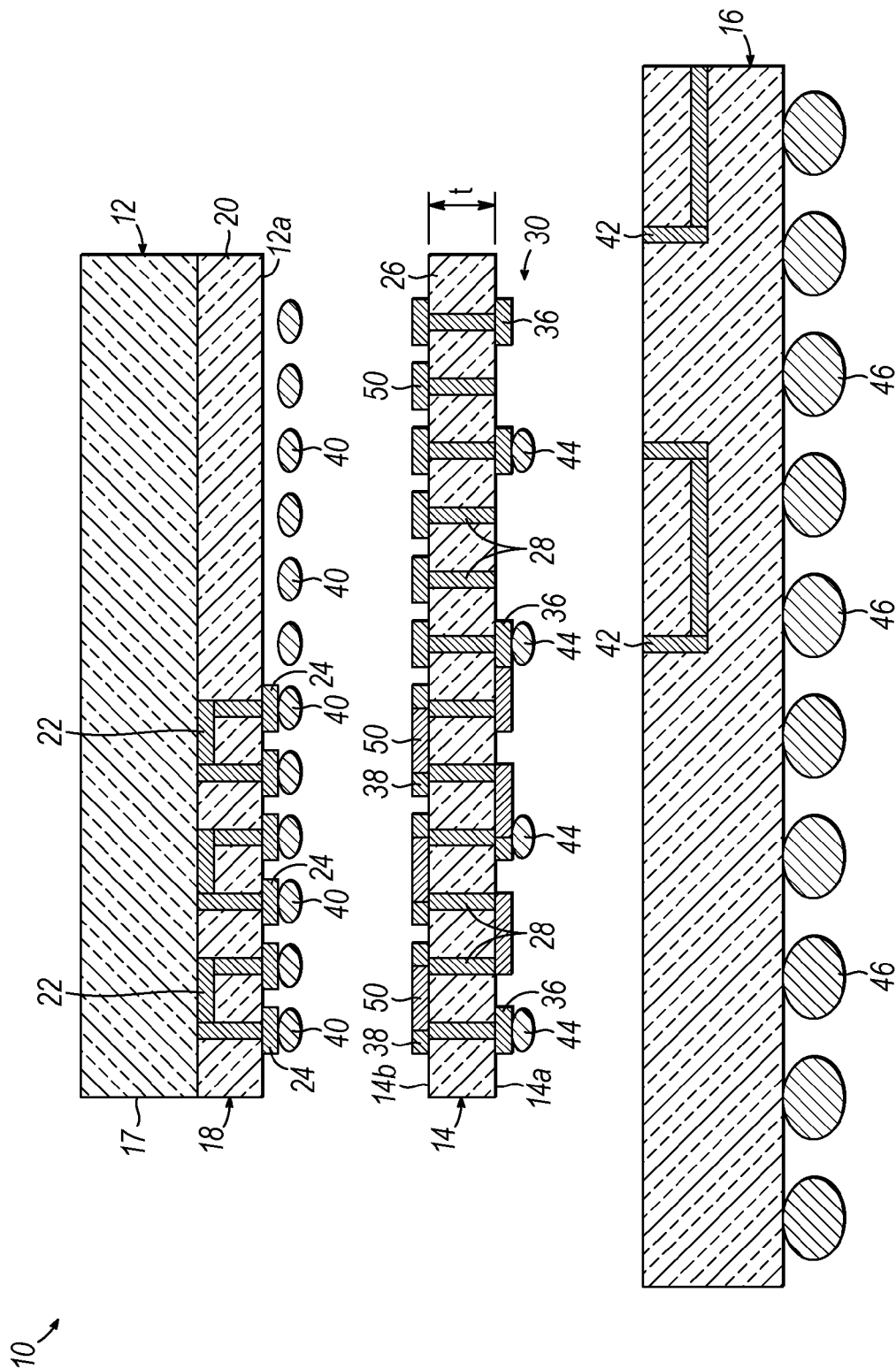
FIG. 1 is an exploded cross-sectional view of an assembly in accordance with an embodiment of the invention.

With reference to FIG. 1 and in accordance with an embodiment of the invention, an assembly 10 includes a chip 12, an interposer 14, and a laminate substrate 16 that are united to form the assembly 10. The chip 12 may comprise a single chip, as in the representative embodiment, or a chip stack comprising a plurality of chips arranged in a stack. The chip 12 may include an FEOL side 12a on which integrated circuits have fabricated with a front-end-of-line (FEOL) process, such as a complementary metal-oxide-semiconductor (CMOS) process. In one embodiment, the chip 12 may be a custom logic or processor chip, and the interposer 14 may function to spread the electrical connections to a wider pitch than for the chip 12 and/or reroute electrical connections. The interposer 14 may also provide interconnections between devices or provide ancillary functions such as providing capacitance or inductance.

The chip 12 may include a substrate 17 used to form integrated circuits and an interconnect structure 18 fabricated with middle-end-of-line and back-end-of-line processes. The interconnect structure 18 is configured to communicate signals to and from the integrated circuits of the chip 12 and to also provide power and ground connections for the integrated circuits of the chip 12. On FEOL side 12a, the interconnect structure 18 of the chip 12 may include one or more dielectric layers 20, metallization 22 in the one or more dielectric layers 20, and bond pads 24 that are coupled with the metallization 22. The bond pads 24 are accessible at the FEOL side 12a of chip 12 for establishing electrical connections with the interposer 14.

The interposer 14 may include a substrate 26 that is comprised of a semiconductor material (e.g., silicon) or, alternatively, that is comprised of a different type of material, such as glass or sapphire. If the substrate 26 is comprised of semiconductor material, then integrated circuits may be fabricated using the substrate 26.

The interposer 14 further includes conductive features in the form of through-substrate vias (TSVs) 28 that extend through the entire thickness of the thickness, t, of the substrate 26. The TSVs 28 may be fabricated by deep reactive ion etching or laser drilling a deep via into the substrate 26, electrically insulating the deep via with a dielectric material, lining the via with a conductive liner that is a diffusion barrier and/or adhesion promoter, and filling the via with a conductor such as a metal (e.g., copper). After the vias are filled, the substrate 26 may be thinned from its back side by grinding and/or a wet or dry etch to reduce its original thickness and thereby expose the opposite end of each TSV 28 at the depth of the vias. The thinning defines a grind side 14b of the interposer 14. The interposer 14 may be functionalized with passive and active circuit elements on a FEOL side 14a, which is separated by the thickness, t, of the substrate 26 from the grind side 14b. The TSVs 28 provide continuous conductive paths between the FEOL side 14a and the grind side 14b for signals, power, and/or ground.

The FEOL side 14a of the interposer 14 may comprise an interconnect structure 30 fabricated with middle-end-of-line and back-end-of-line processes. The FEOL side 14a of the interposer 14 may face the laminate substrate 16. On FEOL side 14a, the interposer 14 may include bond pads 36 and wiring 50 that are coupled with the TSVs 28. The interposer 14 also includes bond pads 38 on its grind side 14b, which are coupled by the TSVs 28 with the bond pads 36 on its FEOL side 14a. The bond pads 38 are also coupled by the solder bumps 40, which may be reflowed C4 (Controlled Collapse Chip Connections) solder balls or other types of solder balls or bumps, with the bond pads 24 at the FEOL side 12a of chip 12. The chip 12 and interposer 14 are joined in a face-to-face fashion by the solder bumps 40 with the solder bumps 40 located between the chip 12 and interposer 14.

The grind side 14b of the interposer 14 may face the FEOL side 12a of the chip 12. The laminate substrate 16 may include metallization 42 that defines a power plane that is used to supply power to the chip 12 via the interposer 14. Solder bumps 44, which may be reflowed C4 solder balls or other types of solder balls or bumps, couple the bond pads 36 at the FEOL side 14a of interposer 14 with the metallization 42. The laminate substrate 16 may be coupled by reflowed solder bumps 46 with a printed circuit board, which may provide the physical structure for mounting and supporting the assembly 10, as well as providing electrical interconnections with other electronic components populating the printed circuit board and coupled with the printed circuit board. Specifically, the assembly 10 may be integrated with other chips, discrete circuit elements, and/or other signal processing devices as part of either (a) an intermediate product, such as a motherboard, or (b) an end product. The end product can be any end product that includes integrated circuit chips, ranging from toys and other low-end applications to advanced computer products having a display, a keyboard or other input device, and a central processor.

In the representative embodiment, the FEOL side 14a of the interposer 14 faces the laminate substrate 16 and the grind side 14b of the interposer 14 faces the FEOL side 12a of the chip 12. Alternatively, the interposer 14 may be oriented such that its grind side 14b faces the laminate substrate 16 and its FEOL side 14a faces the FEOL side 12a of the chip 12. The specific orientation of the interposer 14 may depend on the build approach that is used to form the assembly 10.

Figure 2:
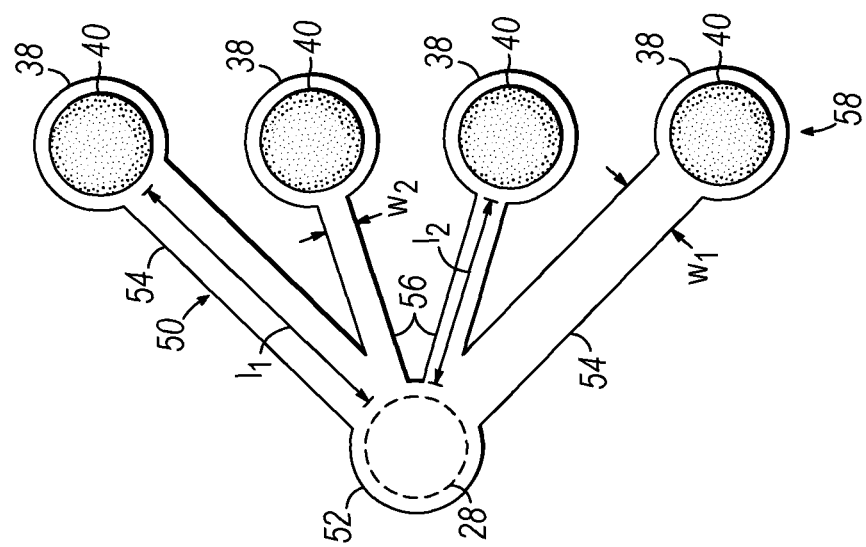

With reference to FIG. 2 and continued reference to FIG. 1, the wiring 50 of the interposer 14 may comprise a redistribution layer on its grind side 14a. The wiring 50 may be coupled with one or more TSVs 28 and thereby distribute power, ground, or signals from one or more TSVs 28 to multiple solder bumps 40. In particular, the wiring 50 may be used to distribute current from the one or more TSVs 28, when powered, to multiple solder bumps 40. The solder bumps 40 and wiring 50 are arranged in a configuration that may enable an increased number of solder bumps 40 to feed current to the TSV 28 or to receive current from the TSV 28 by configuring the widths of the connection lines to ensure that the current flowing to/from each solder bump 40 from the TSV 28 is equal.

The wiring 50 on the grind side 14b of the interposer 14 includes the bond pads 38, a section 52 overlying one of the TSVs 28, a plurality of connection lines 54, and a plurality of connection lines 56. Each of the connection lines 54, 56 originates at the section 52 and terminates at its opposite end at one of the bond pads 38. In the representative embodiment, only a single TSV 28 is associated with the section 52 of wiring 50. One of the solder bumps 40 is associated with each of the bond pads 38, and the bond pads 38 and solder bumps 40 are linearly arranged in a row 58 adjacent to the TSV 28.

The bond pads 38 and solder bumps 40 are located adjacent to the TSV 28, and the connection lines 54, 56 extend toward the TSV 28 and section 52. The connection lines 54, 56 thereby couple the TSV 28, which is located at the shared origin at the opposite end of the connection lines 54, 56, with the bond pads 38 and solder bumps 40. In this manner, the wiring 50 promotes the sharing of the TSV 28 and the distribution of its current among the different bond pads 38 and solder bumps 40.

The wiring 50 may be formed from a layer of a conductor, which is deposited, masked, and etched to define the connection lines 54, 56 and section 52. To that end, the layer of conductor may be deposited and a mask layer may be applied to its top surface. The conductor constituting the connection lines 54, 56 is characterized by an electrical resistivity (i.e., $\rho$) that may be measured in ohm-meters ($\Omega \cdot m$). In an embodiment, the conductor may be a metal having an electrical resistivity of less that $10^{-7}$ $\Omega \cdot m$. In another embodiment, the conductor may be copper characterized by an electrical resistivity of $1.72 \times 10^{-8}$ $\Omega m$. The mask layer may comprise, for example, a photoresist that is applied with a spin coating process, pre-baked, exposed to a radiation projected through a photomask, baked after exposure, and developed with a chemical developer to define a pattern with lines of photoresist covering the intended positions of the connection lines 54, 56. An etching process may be used to define the connection lines 54, 56 from the conductor layer. The etching process may comprise a wet chemical etch or a dry etch, and may rely on a given etch chemistry. After the connection lines 54, 56 are defined, the mask layer may be removed by oxygen plasma ashing or wet chemical stripping, and a conventional cleaning process may be applied to remove any contaminants.

The respective lengths of the connection lines 54, 56 may be adjusted relative to the locations of multiple solder bumps 40 adjacent to the TSV 28 so that the TSV 28 can be coupled with these adjacent solder bumps 40. In the representative embodiment, the connection lines 54 are longer than connection lines 56. Specifically, the connection lines 54 have a length, $l_1$, between its opposite ends that is greater than a length, $l_2$, of the connection lines 56. The ends and lengths of each of the connection lines 54, 56 may extend from the intersection with the respective bond pad 38 (and associated solder bump 40) to the intersection with the section 52 of wiring 50. The section 52 is shared by the connection lines 54, 56 and may contribute the same amount of electrical resistance to each of the connection lines 54, 56. Similarly, each of the connection lines 54, 56 includes a bond pad 38, which may also contribute the same amount of electrical resistance to each of the connection lines 54, 56.

In the representative embodiment, the connection lines 54, 56 are linear. In an alternative embodiment, one or both of the different types of the connection lines 54, 56 may alternatively include a plurality of joined segments that collectively define the respective lengths and that are piecewise joined together in a linked chain with angled intersections between the different segments. In an alternative embodiment, the layout of the connection lines 54, 56 may be influenced by the position of the TSV 28 relative to the row 58 of solder bumps 40 such that the individual connection lines 54 and/or the individual connection lines 56 may have different lengths.

The cross-sectional area of the connection lines 54 may systematically differ from the cross-sectional area of the connection lines 56. In one embodiment, the width, $w_1$, of the connection lines 54 may differ from the width, $w_2$, of the connection lines 56. The selection of the respective cross-sectional areas or widths is utilized as a factor to systematically control the resistance of the connection lines 54, 56.

The cross-sectional area of each of the connection lines 54, 56 in a plane normal to the respective longitudinal axis is given by the product of the width and thickness. In an embodiment, the connection lines 54, 56 may have uniform thicknesses, and the cross-sectional area of the respective connection lines 54, 56 may not vary along their respective lengths so that the cross-sectional area is constant along the length. In another embodiment, the connection lines 54, 56 may have uniform thicknesses, and the widths of the respective connection lines 54, 56 may not vary along their respective lengths so that the width is constant along the length. Each of the connection lines 54, 56 may then constitute a conductor of uniform cross-sectional area along its length for which the electrical resistance can be determined from the product of the electrical resistivity and a ratio of the respective length to the respective cross-sectional area. However, the connection lines 54 and/or the connection lines 56 may include lengthwise variations in the cross-sectional area and/or width in which the segments of different cross-sectional area and/or width are taken into consideration by the determination of electrical resistance.

In an embodiment, the respective cross-sectional areas of the connection lines 54, 56 may be selected such that the electrical resistance of each of the connection lines 54 is equal to the electrical resistance of each of the connection lines 56. To that end and in an embodiment, the width, $w_1$, of the connection lines 54 may be selected to be greater than the width, $w_2$, of the connection lines 56 in order to compensate for the longer length, $l_1$, of the connection lines 54 relative to the length, $l_2$, of the connection lines 56 when determining the electrical resistance. The connection lines 54 of longer length and greater width are coupled with bond pads 38 and solder bumps 40 that are more distant from the TSV 28 than those coupled with the connection lines 56 of shorter length and lesser width. Due to the inverse dependence of electrical resistance on cross-sectional area and on width for a uniform thickness, the reduced width of the connection lines 56 relative to connection lines 54 permits the electrical resistances to be equalized among the connection lines 54, 56.

According to Ohm's law and when powered by virtue of the equal electrical resistances, the current flowing through connection lines 54 from the TSV 28 to their terminating bond pads 38 and associated solder bumps 40 may be the same as the current flowing through connection lines 56 from the TSV 28 to their terminating bond pads 38 and associated solder bumps 40 so that the current is evenly distributed. The balancing of the currents delivered to the different solder bumps 40 assumes that the load on the respective solder bumps 40 is uniform. If the loads are different, then the currents may differ and/or the different loads may be taken into account when determining the line widths.

The current-carrying capacity of the TSV 28 may be greater than the individual current-carrying capacity of each solder bump 40. The wiring 50 may increase the ability to distribute power from the TSV 28 to multiple nearby solder bumps 40 so that the full current-carrying capacity of the TSV 28 can be realized and the current-carrying capacity of the TSV 28 is less constrained by the lower current-carrying capacity of the solder bumps 40. The wiring 50 may also relax size constraints on the number of solder bumps 40 that can be nearest neighbors of the TSV 28. The adjustments to the cross-sectional areas of the connection lines 54, 56 can be used to ensure that solder bumps 40 closer to the TSV 28 do not draw higher current than the solder bumps further from the TSV. The adjustments to the cross-sectional areas of the connection lines 54, 56 can be adapted to reflect different numbers of solder bumps 40 of different sizes and/or current-carrying capacity.

Alternatively, the selected cross-sectional areas of the connection lines 54, 56 may be used to meter the current supplied to the bond pads 38 and solder bumps 40 so that the supplied currents are unequal. For example, the cross-sectional area and/or width, $w_1$, of the connection lines 54 may be selected to be greater than the cross-sectional area and/or width, $w_2$, of the connection lines 56, but may be selected to under-compensate for the greater length, $l_1$, of the connection lines 54 relative to the shorter length, $l_2$, of the connection lines 56 in the determination of the electrical resistance. In this instance, the connection lines 54 may have a higher electrical resistance than the connection lines 56. Under Ohm's law and when powered, a smaller current may flow from the TSV 28 to the bond pads 38 and solder bumps 40 fed by the connection lines 54 than those solder bumps 40 fed by the connection lines 56. In this embodiment characterized by different electrical resistances, the cross-sectional area of the connection lines 54 may be selected to be less than the cross-sectional area of the connection lines 56 and/or the cross-sectional area of connection lines may be selected such that the electrical resistance of connection lines 54 is less than connection lines 56.

In an alternative embodiment, the chip 12 may be connected with an adjacent chip to form a chip stack and may include through-substrate vias (TSVs) similar to TSVs 28. The adjacent chip may be similar to the chip 12 or different from chip 12 in terms of function. For example, the adjacent chip may be a memory chip if chip 12 is a custom processor chip. Such stacked chip arrangements may exhibit improved performance, bandwidth, and/or functionality compared with non-stacked-arrangements. For example, a stacked chip arrangement improve electrical performance due to the short interconnects and high number of TSV interconnections between stacked chips. As another example, a stacked chip arrangement may permit the heterogeneous integration of logic, memory, graphics, power and sensor ICs that cannot otherwise be integrated into a single chip. Chip 12 and/or the adjacent chip to chip 12 may include wiring similar to the wiring 50 that is used with width adjustments in the connection lines to adjust the current supplied to from the TSVs to the solder bumps connecting the chip 12 with the adjacent chip in the chip stack. In an alternative embodiment, wiring similar to wiring 50 may be used to adjust the current supplied from the laminate substrate 16 to the bond pads 36 and solder bumps 44 on the FEOL side 14a of the interposer 14 with the metallization 42.

Figure 3:
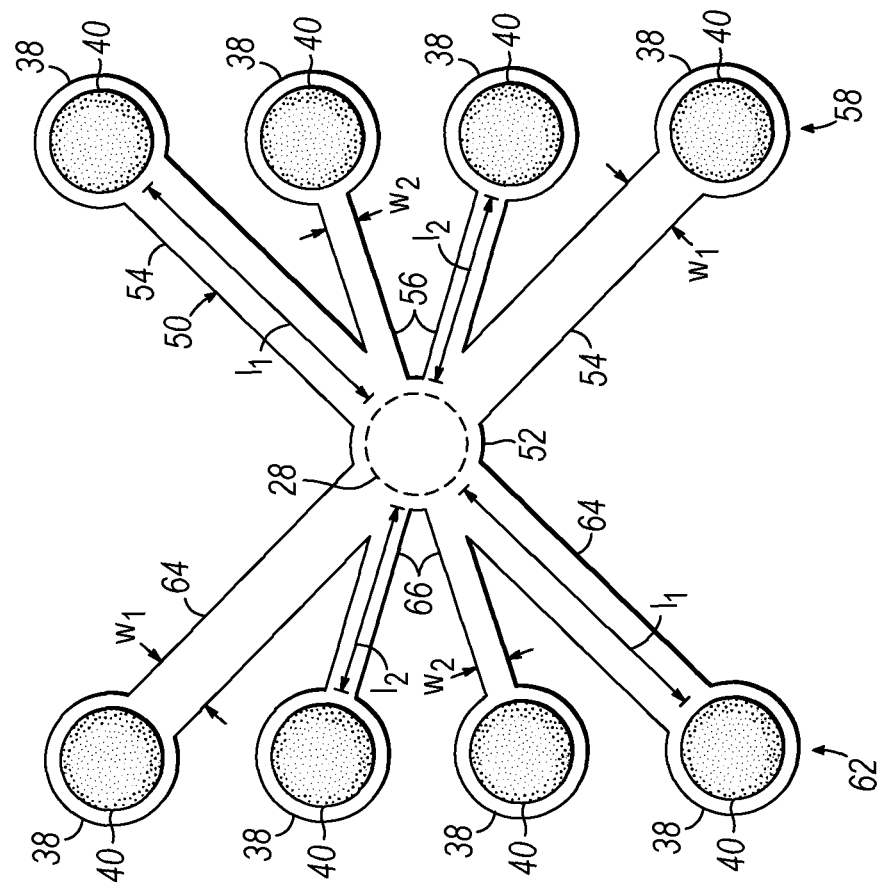
FIGS. 2-5 are top views of wiring present on an interposer of the assembly in FIG. 1.

With reference to FIG. 3 in which like reference numerals refer to like features in FIG. 2 and in accordance with an alternative embodiment of the invention, the wiring 50 may further include additional connection lines 64 analogous to connection lines 54 and additional connection lines 66 analogous to connection lines 56 each terminating at one end with one of the bond pads 38 on the grind side 14b of the interposer 14. The bond pads 38 and the solder bumps 40 associated with the bond pads 38 are linearly arranged in a row 62. The TSV 28 is positioned between row 58 and row 62 such that the TSV 28 feeds current to the bond pads 38 and the solder bumps 40 in each of the rows 58, 62. The addition of the connection lines 64, 66 to connection lines 54, 56 promotes connections with multiple parallel rows 58, 62 of bond pads 38 and solder bumps 40.

The respective cross-sectional areas of the connection lines 64, 66 may be selected as discussed above with respect to connection lines 54, 56 and in coordination with the selection of the respective widths of the connection lines 54, 56. In one embodiment, the lengths and widths of the connection lines 64, 66 may be the same as the lengths $l_1$, $l_2$ and widths $w_1$, $w_2$ of the connection lines 54, 56. Alternatively, the lengths and/or widths of the connection lines 64, 66 may differ from the lengths $l_1$, $l_2$ and/or widths $w_1$, $w_2$ of the connection lines 54, 56 so long as the respective widths are selected to adjust the electrical resistance as discussed above with respect to connection lines 54, 56.

Figure 4:
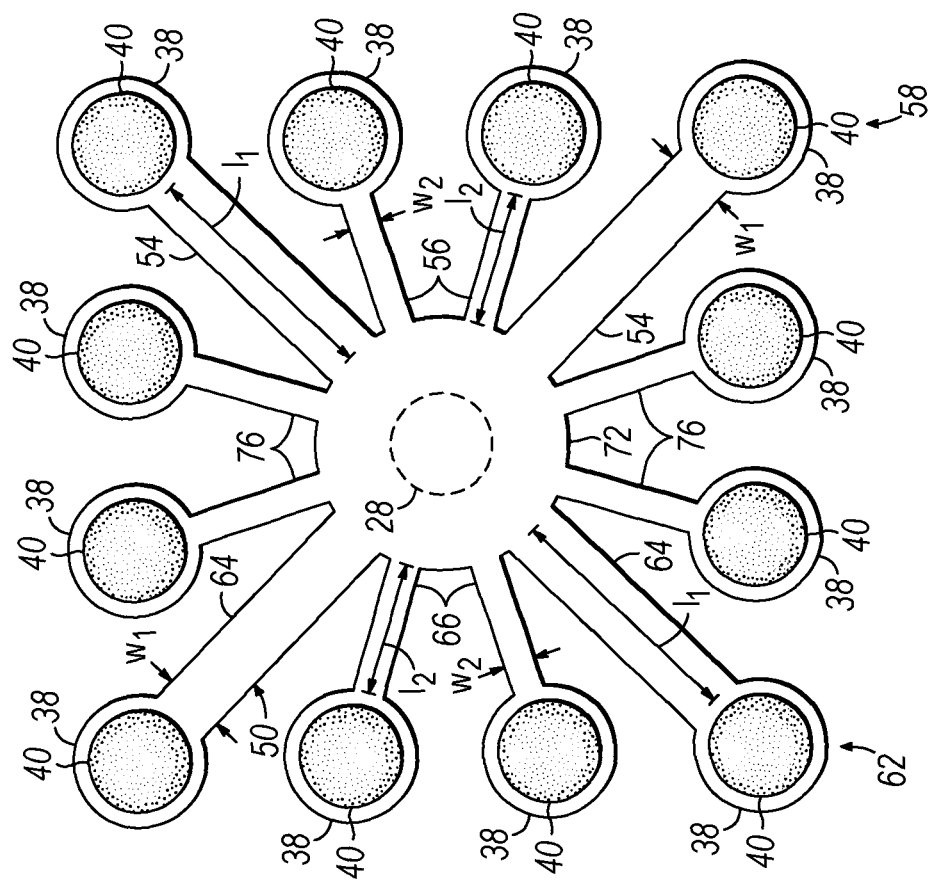

With reference to FIG. 4 in which like reference numerals refer to like features in FIG. 3 and in accordance with an alternative embodiment of the invention, the wiring 50 may further include additional connection lines 76 analogous to connection lines 56 each terminating at one end with one of the bond pads 38 on the grind side 14b of the interposer 14. The bond pads 38 and the solder bumps 40 associated with the bond pads 38 coupled with the connection lines 76 are disposed between the rows 58, 62 so that the TSV 28 is surrounded by the bond pads 38 and solder bumps 40. The cross-sectional areas of the connection lines 76 may be selected as discussed above with respect to connection lines 54, 56, 64, 66. The wiring 50 may include a section 72 that is positioned between the TSV 28 and the bond pads 38 and solder bumps 40, and that is larger than section 52 (FIG. 2). The section 72 of wiring 50 may improve the uniformity of the current distribution.

Figure 5:
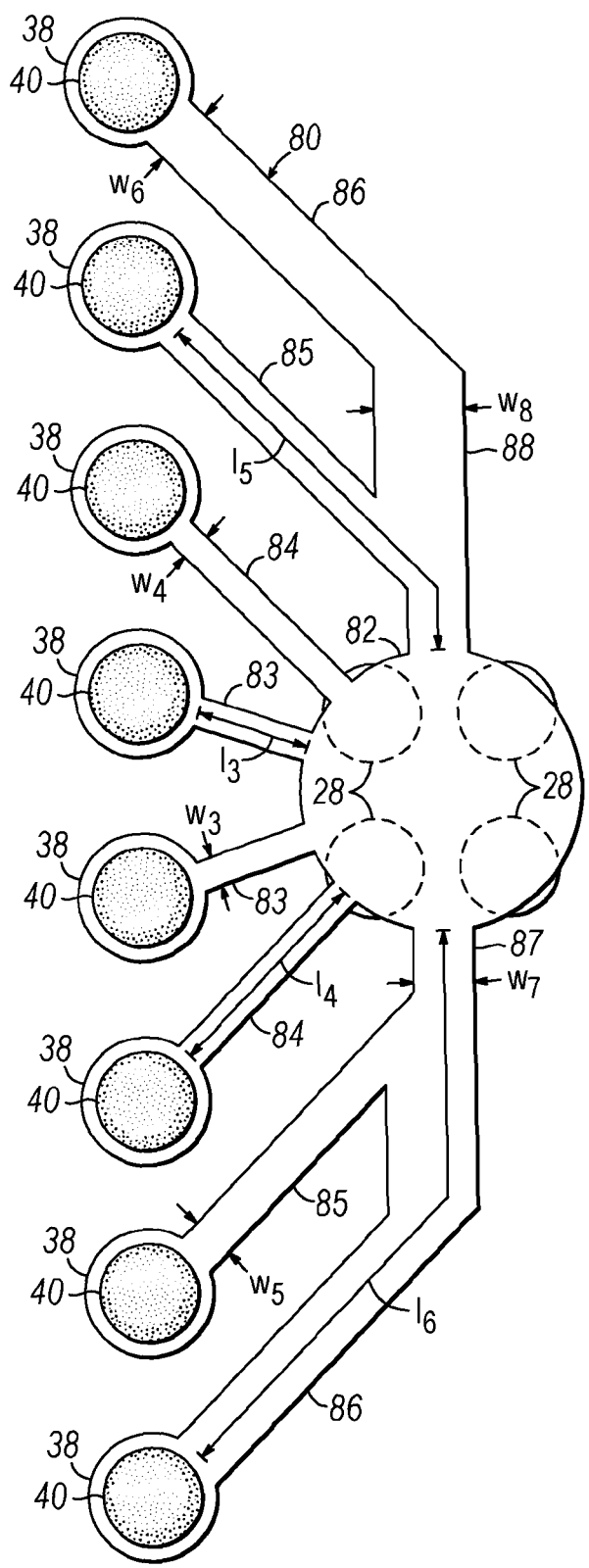

With reference to FIG. 5 in which like reference numerals refer to like features in FIGS. 2-4 and in accordance with an alternative embodiment of the invention, wiring 80 that is similar to the wiring 50 may be configured to couple the bond pads 38 and solder bumps 40 with multiple TSVs 28 that are themselves coupled with a section 82 that is similar to section 72. The enlarged section 82 may promote the coupling of the multiple TSV's with the wiring 80 by increasing the surface area available for such coupling. The wiring 80 includes connection lines 83, 84, 85, 86 each terminating at one end with one of the bond pads 38 on the grind side 14b of the interposer 14. Each of the connection lines 83, 84, 85, 86 is coupled by one of the bond pads 38 with a respective solder bump 40.

Connection lines 83 have a width, $w_3$, and length, $l_3$, and are each constituted by a linear segment. Connection lines 84 have a width, $w_4$, and length, $l_4$, and are each constituted by a linear segment. Connection lines 85 include a segment of width, $w_5$, and a segment 87 of width, $w_7$, that collectively provide the length, $l_5$. Connection lines 86 include a segment 86 of width, $w_6$, a segment 88 of width, $w_8$, and the segment 87 that collectively provide the length, $l_6$. The connection lines 85, 86 exhibits a change in direction along their respective length. The cross-sectional area of the connection lines 83, 84, 85, 86 and the cross-sectional area of the segments 87, 88 may be selected in the same manner as the widths of connection lines 54, 56 to compute electrical resistances that provide a desired power distribution. The section 82, which is shared by the connection lines 83, 84, 85, 86, may contribute the same electrical resistance to each of the connection lines 83, 84, 85, 86 as an offset.

The connection lines 83, 84, 85, 86 may be arranged and include dimensions that permit the bond pads 38 to match the arrangement for a row of solder bumps 40. Additional connection lines similar to connection lines 83, 84, 85, 86 can be added to the wiring 80. In an alternative embodiment, the wiring 80 may be used to couple the TSVs 28 with another row of solder bumps 40 arranged in a row that is parallel and spaced apart from the row of solder bumps 40 coupled with connection lines 83, 84, 85, 86. The additional connection lines would be arranged and include dimensions to add another set of bond pads 38 to match the locations of solder bumps 40 in the added row. The TSVs 28 can then be coupled by the expanded set of connection lines with multiple parallel rows of solder bumps 40.

Figure 6:
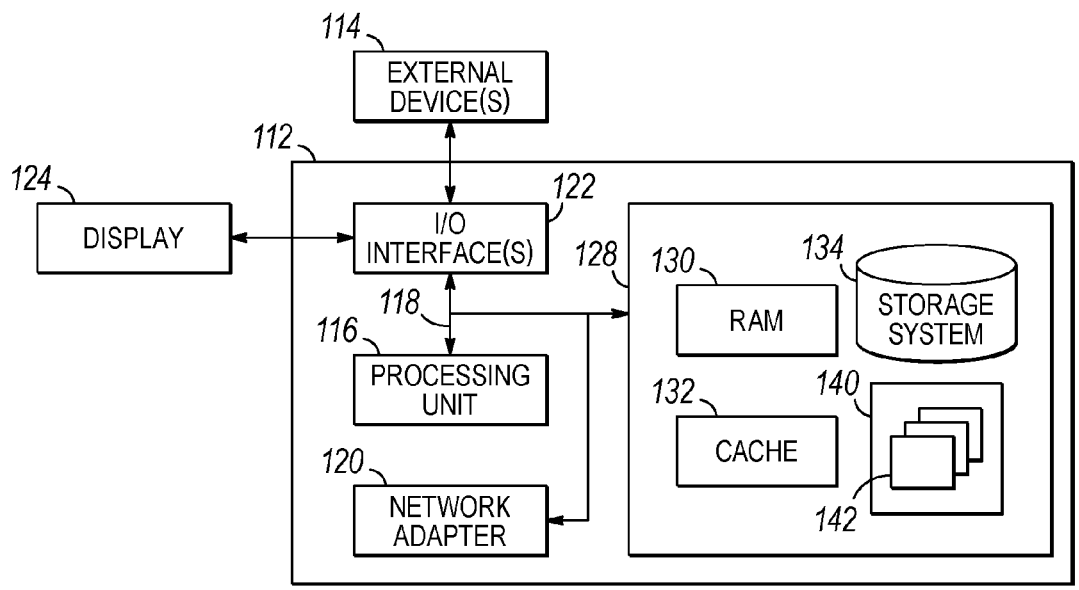
FIG. 6 is a diagrammatic view of an exemplary computer system configured to determine a wiring layout consistent with the embodiments of the invention.

Referring now to FIG. 6, a schematic of an exemplary computer system 112 is shown. The computer system 112 may include one or more processors or processing units 116, a system memory 128, and a bus 118 that couples various system components including system memory 128 to each processing unit 116. Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 112 typically includes a variety of computer system readable media. Such media may be any available media that is accessible by computer system 112, and it includes both volatile and non-volatile media, removable and non-removable media.

System memory 128 can include computer system readable media in the form of volatile memory, such as random access memory (RAM) 130 and/or cache memory 132. Computer system 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 118 by one or more data media interfaces. As will be further depicted and described below, system memory 128 may include at least one program product having a set (e.g., at least one) of program modules that are configured to carry out the functions of embodiments of the invention.

Program/utility 140, having a set (at least one) of program modules 142, may be stored in system memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention as described herein.

Computer system 112 may also communicate with one or more external devices 114 such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via Input/Output (I/O) interfaces 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system 112 via bus 118. It should be understood that although not shown, other hardware and/or software components could be used in conjunction with computer system 112. Examples, include, but are not limited to: microcode, device drivers, redundant processing units, external disk drive arrays, RAID systems, tape drives, and data archival storage systems, etc.

Figure 7:
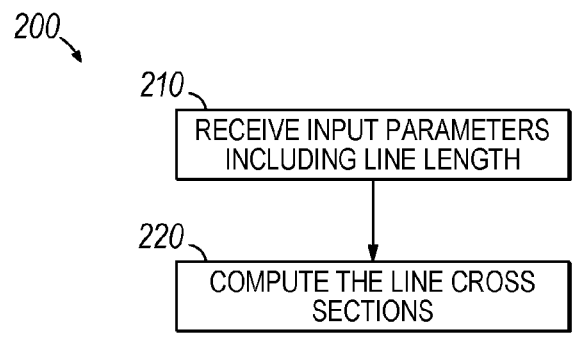
FIG. 7 is a flow chart detailing a method of determining cross-sectional areas of connection lines in accordance with an embodiment of the invention.

FIG. 7 provides a flowchart 200 that illustrates a sequence of operations that may be performed by the computer system 112 to design wiring consistent with the embodiments of the invention.

In block 210, input parameters characterizing a layout for the wiring are received at the computer system 112. For example, the computer system 112 may receive a set of input parameters characterizing the wiring, such as the length and arrangement of each of the connection lines, a thickness and electrical resistivity of the constituent material of the connection lines, one or more TSVs that are to be coupled with the connection lines, the position of each TSV relative to the connection lines, the positions of solder bumps and bond pads relative to each TSV, etc. The length and arrangement of the connection lines may be influenced by the positions of the solder bumps and bond pads, especially if these positions are predetermined (e.g., in a row). In this regard, the positions of the solder bumps and bond pads may provide a constraint on the layout that is determined for the wiring. In one embodiment, all connection lines are linear current paths relative to an origin at the one or more TSVs. In another embodiment, the positions of the solder bumps and bond pads may result in one or more of the connection lines including multiple segments that are connected to provide a current path.

The system may also receive, as an input parameter, a current that is to be supplied from the one or more TSV's by the connection lines to each of the solder bumps. In an embodiment, the currents supplied to each of the solder bumps may be equal so that the current distribution by the connection lines is balanced. In an alternative embodiment, the currents supplied to each of the solder bumps may be unequal so that the current distribution by the connection lines is metered to the different solder bumps and unbalanced.

In block 220, based upon the input parameters, the computer system 112 may compute a cross-sectional area for each of the multiple connection lines that determines respective electrical resistances and results in the desired distribution of currents. As discussed above, the currents to the solder bumps may be either equal or unequal.

In one embodiment, the computer system 112 may compute a width for each of the connection lines of uniform thickness and the computation of the respective widths by the computer system 112 may provide the connection lines with the same electrical resistance calculated per Ohm's Law. As a result, during operation, the current flowing from the one or more powered TSVs to each of the bumps may be equal so that the power distribution is balanced. In an alternative embodiment, the computer system 112 may compute a cross-sectional area for each of the connection lines and the computation of the respective cross-sectional areas by the computer system 112 may provide the connection lines with different electrical resistances. As a result, during operation, the current from the one or more powered TSVs to each of the bumps may be differ so that a lesser current is supplied to some bumps and a greater current is supplied to other bumps.

The determination of the cross-sectional area may be couched in terms of electrical conductivity, which has a reciprocal relationship with electrical resistivity. The determination of the electrical resistance may constrain the conductors of the wiring to have a uniform cross-sectional area and/or uniform width along their respective lengths. However, the cross-sectional area and/or width may be piecewise varied along the length of a given connection line such that the result of the computation is a cross-sectional area and/or width for each segment in a set of segments that collectively comprise the connection line. In this instance, a set of correlated lengths and cross-sectional areas/widths may be determined for a given connection line, and associated with the different segments constituting the connection line.

The cross-sectional areas and/or widths of the different connection lines may be determined based on electrical resistance under an assumption that the load on the respective solder bumps is uniform such that the voltage drops used as a factor in the Ohm's Law calculation are equal. However, if the loads are different, then the cross-sectional area and/or width determinations may consider this variable factor.

An integrated circuit layout that includes a layout for wiring comprising the connection lines may be received at a fabrication facility. The layout for the connection lines may include parameters such as the lengths, cross-sectional areas, and/or the widths of the connection lines. The connection lines of the integrated circuit may be fabricated, as discussed herein, consistent with the parameters of the integrated circuit layout.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   directing a first current from a first through-substrate via of an interposer through a first connection line to a first bump; and
   directing a second current from the first through-substrate via of the interposer through a second connection line to a second bump, wherein each of the first connection line and the second connection line forms wiring on a grid side of the interposer, and wherein each of the first connection line and the second connection line has a first end that originates from a section of the wiring on the grid side of the interposer that overlies the first through-substrate via and a second end that terminates at a bond pad that is also present on the grid side of the interposer;
   wherein the first connection line has a first length relative to a first position of the first bump and a first cross-sectional area, the second connection line has a second length relative to a second position of the second bump and a second cross-sectional area, the second length is different from the first length, and the second cross-sectional area is different from the first cross-sectional area.

2. The method of claim 1 wherein the first current is equal to the second current.

3. The method of claim 2 wherein the first connection line has a first electrical resistance, and the second connection line has a second electrical resistance that is equal to the first electrical resistance.

4. The method of claim 1 wherein the first current and the second current are unequal.

5. The method of claim 1 wherein the first length is greater than the second length, and the first cross-sectional area is greater than the first cross-sectional area.

6. The method of claim 1 wherein the first current and the second current each further include a contribution from a second through-substrate via coupled with the first connection line and the second connection line.

7. The method of claim 1 wherein the first cross-sectional area is uniform along the first length, and the second cross-sectional area is uniform along the second length.

8. A method for providing a wiring structure coupled with a through-substrate via, the method comprising:
   receiving, at a processor, a first current and a first length for a first connection line coupling the through-substrate via of an interposer with a first bump;
   receiving, at the processor, a second current and a second length for a second connection line coupling the through-substrate via of the interposer with a second bump, wherein each of the first connection line and the second connection line forms wiring on a grid side of the interposer, and wherein each of the first connection line and the second connection line has a first end that originates from a section of the wiring on the grid side of the interposer that overlies the first through-substrate via and a second end that terminates at a bond pad that is also present on the grid side of the interposer;
   determining, by the processor, a first cross-sectional area for the first connection line based upon the first current and the first length such that the first connection line has a first electrical resistance; and
   determining, by the processor, a second cross-sectional area for the second connection line based upon the second current and the second length such that the second connection line has a second electrical resistance.

9. The method of claim 8 wherein the first electrical resistance of the first connection line is equal to the second electrical resistance of the second connection line.

10. The method of claim 8 wherein the first electrical resistance of the first connection line is not equal to the second electrical resistance of the second connection line.

11. The method of claim 8 wherein the first cross-sectional area is uniform along the first length, the second cross-sectional area is uniform along the second length, and the determination of the first cross-sectional area and the second cross-sectional area is further based on a first width of the first connection line and a second width of the second connection line.

12. The method of claim 8 further comprising:
   receiving an integrated circuit layout comprising the first cross-sectional area and the first length for the first connection line and the second cross-sectional and the second cross-sectional area for the second connection line;
   depositing a layer of a conductor;
   masking the layer with an etch mask; and
   after masking the layer, etching the layer to form the first connection line and the second connection line.

* * * * *